United States Patent
Abel et al.

(10) Patent No.: US 6,518,906 B2
(45) Date of Patent: Feb. 11, 2003

(54) USE OF CURRENT FOLDING TO IMPROVE THE PERFORMANCE OF A CURRENT-STEERED DAC OPERATING AT LOW SUPPLY VOLTAGE

(75) Inventors: Christopher J Abel, Coplay, PA (US); Joseph Anidjar, Asbury, NJ (US); Peicheng Ju, Berkeley Heights, NJ (US)

(73) Assignee: Agere Systems Guardian Corp., Orlando, FL (US)

(*) Notice: Subject to any disclaimer, the term of this patent is extended or adjusted under 35 U.S.C. 154(b) by 8 days.

(21) Appl. No.: 09/906,162

(22) Filed: Jul. 16, 2001

(65) Prior Publication Data

US 2002/0030619 A1 Mar. 14, 2002

Related U.S. Application Data

(60) Provisional application No. 60/220,596, filed on Jul. 25, 2000.

(51) Int. Cl.[7] .............................................. H03M 1/66
(52) U.S. Cl. ........................ 341/144; 341/119; 236/115
(58) Field of Search ................................. 341/144, 145, 341/155, 156, 133, 134, 135, 118, 136, 119; 326/115; 327/65, 89, 108; 330/252, 253

(56) References Cited

U.S. PATENT DOCUMENTS

| | | | | |
|---|---|---|---|---|
| 4,095,164 A | * | 6/1978 | Ahmed ........................... | 323/8 |
| 4,887,047 A | * | 12/1989 | Somerville ................... | 330/257 |
| 5,109,169 A | * | 4/1992 | Hughes ....................... | 307/490 |
| 5,666,044 A | * | 9/1997 | Tuozzolo ..................... | 323/277 |
| 5,790,060 A | * | 8/1998 | Tesch .......................... | 341/119 |
| 5,828,330 A | * | 10/1998 | Benzel ......................... | 341/159 |
| 5,892,471 A | * | 4/1999 | Mahant-Shetti et al. .... | 341/135 |
| 5,994,884 A | * | 11/1999 | Paterno ....................... | 323/268 |
| 6,366,140 B1 | * | 4/2002 | Warwar ....................... | 327/108 |

OTHER PUBLICATIONS

Takahiro Miki et al. "An 8–MHz 8–bit CMOS D/A Converter" IEEE Journal vol. SC–21, No. 6, Dec. 1986, pp. 983–988.*
David B. Ribner et al. "Design Techniques for Cascoded CMOS Op Amps with Improved PSRR and Common–Mode Input Range" IEEE Journal, vol. SC–19, No. 6, Dec., 1984, pp. 919–925.*
Mohammed Ismail and Terri Fiez, "Analog VLSI Signal and Information Processing", McGraw–Hill, Inc.*
Behzad Razavi, Principles of Data Conversion System Designs, IEEE Press, copyright 1995, pp. 90–95.*

* cited by examiner

*Primary Examiner*—Brian Young
*Assistant Examiner*—John Nguyen

(57) ABSTRACT

The performance of a single-bit cell in a DAC is improved by decoupling the voltage swing across the load resistors from the output of the current steering device. This can be achieved by providing for a single-bit cell having a first load resistor R1 and a second load resistor R2, a current steering circuit, and a decoupling circuit operably coupled between the current steering circuit and the resistors R1, R2. The current steering circuit steers at least part of a current I1 through a circuit path towards either the first resistor R1 or the second resistor R2. The decoupling circuit decouples voltage swings across the load resistors R1, R2 from the current steering circuit.

15 Claims, 5 Drawing Sheets

USE OF CURRENT FOLDING TO IMPROVE THE PERFORMANCE OF A CURRENT -STEERED DAC OPERATING AT LOW SUPPLY VOLTAGE

This application claims the benefit of U.S. Provisional Application No. 60/220,596 that was filed on Jul. 25, 2000.

FIELD OF THE INVENTION

This invention relates to Digital-to-Analog Converter (hereinafter "DAC") technology. Specifically, the invention proposes a system for improving the performance of a DAC.

BACKGROUND OF A PROBLEM

FIG. 6 shows a single-bit cell in a standard CMOS current-steered Digital-to-Analog Converter (DAC). In this circuit, m1 and m2 form a cascode current source, where the DC bias voltages $V_{B1}$ and $V_{B2}$ are generated by a dedicated bias generator (not shown). The DC current which is output by this current source is "steered" to either the $R_{LP}$ or the $R_{LN}$ load resistor, thus either increasing or decreasing the differential output voltage $V_{OUT}$, by a source-coupled differential pair consisting of transistors m3 and m4.

In a "thermometer-coded" DAC, with an N-bit digital input, $2^N-1$ of the bit cells shown in FIG. 1 are connected in parallel; See "An 80 MHz 8-bit CMOS D/A Converter", by T. Miki et. al., IEEE Journal Solid-State Circuits, vol. SC-21, No. 6, December 1986. In this case, each bit cell represents one least-significant bit (LSB). Thus, if the DAC input increases or decreases by one LSB, then the logical input to one of the bit cells, BIT, is either asserted or de-asserted in order to increase or decrease the output voltage by one LSB ($1/(2^N-1)$ times its peak-to-peak full scale value). Other known DAC architectures combine bit cells with scaled current sources and scaled device sizes to produce the same DAC functionality with fewer bit cells (for example, an N-bit "binary-weighted" DAC requires only N bit cells; See "Principles of Data Conversion System Design", by Behzad Razavi, 1995, IEEE Press, p. 90. Although each of these architectures has advantages and disadvantages, the performance of each is fundamentally limited by the performance of a single-bit cell.

Accordingly, this invention improves the performance of a single-bit cell in a DAC.

SUMMARY OF THE INVENTION

This invention improves the performance of a single-bit cell in a DAC by decoupling the voltage swing across the load resistors from the output of the current steering device. The invention provides for an electrical circuit including a first load resistor R1 and a second load resistor R2, a current steering circuit, and a decoupling circuit operably coupled between the current steering circuit and the resistors R1, R2. The current steering circuit steers at least part of a current I1 through a circuit path towards either the first resistor R1 or the second resistor R2. The decoupling circuit decouples voltage swings across the load resistors R1, R2 from the current steering circuit.

BRIEF DESCRIPTION OF THE DRAWINGS

The features and advantages of the invention will be apparent from the following description, as illustrated in the accompanying Figures in which like reference characters refer to the same elements throughout the different Figures.

DETAILED DESCRIPTION

Figure 1:
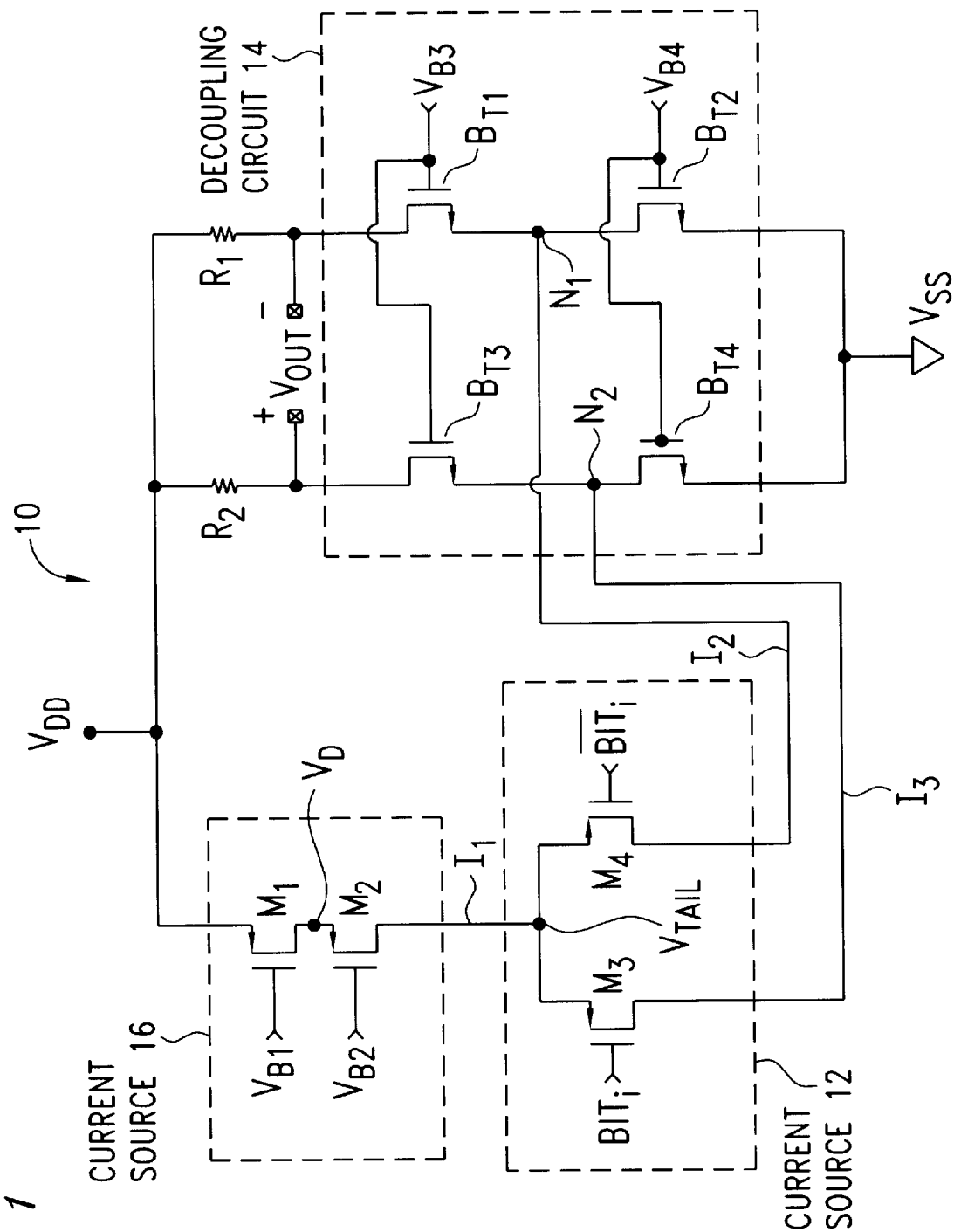
FIG. 1 is a schematic diagram of an electrical circuit in accordance with the present invention.

FIG. 1 illustrates a schematic diagram of an electrical circuit 10 in accordance with the present invention. The electrical circuit includes a first load resistor R1 and a second load resistor R2, a current steering circuit 12, and a decoupling circuit 14 operably coupled between the current steering circuit 12 and the resistors R1, R2. The current steering circuit 12 steers at least part of a current I1 through a circuit path towards either the first resistor R1 or the second resistor R2. The decoupling circuit 14 decouples voltage swings across the load resistors R1, R2 from the current steering circuit 12. The electrical circuit 10 improves the performance of a single-bit cell in a DAC by decoupling a voltage swing across the load resistors R1, R2 from the output of the current steering circuit 12.

The current I1 can be generated by a current source 16. The current source 16 can be formed of a transistor m1 and a transistor m2 in a cascode arrangement. The current steering circuit 12 steers at least part of the current I1 through a circuit path in response to a control signal $Bit_i$. The current steering circuit 12 can include a first switching transistor m3 and a second switching transistor m4. Typically, the switching transistors m3 and m4 are alternately conducting, that is when one transistor is on, the other transistor is off. In operation, the current steering circuit 12 steers the current I1 along a circuit path I2 towards resistor R1 when the control bit $Bit_i$ is low, and the current steering circuit 12 steers the current I1 along a circuit path I3 towards resistor R2 when the control bit $Bit_i$ is high.

The inventors have recognized that in a well-designed current-steered DAC, the maximum value of the update rate is limited by the settling behavior at the output voltage, Vout of FIG. 1. That is, the update rate is limited by the RC time constant formed by the load resistors R1, R2 and by the parasitic capacitance at the output nodes. To limit the maximum value of the update rate, the voltage variation at the "tail" node, labeled $V_{TAIL}$ in FIG. 1, and the variation of the drain voltage of transistor m1, labeled $V_D$, must be limited. Furthermore, voltage variations that do occur at $V_{TAIL}$ and $V_D$ must settle more quickly than the voltage variations at Vout.

To achieve these goals, the output conductances of all four transistors m1, m2, m3 and m4, and the parasitic capacitances at each of the nodes $V_{TAIL}$ and $V_D$ must be minimized. In standard design practice, the parasitic capacitances are minimized by minimizing the transistor widths, while the output conductances are minimized by maximizing $V_{DS}-V_{DSAT}$ for each transistor in order to force each transistor further into saturation region operation. Reducing transistor widths and increasing lengths increases both $V_{DS}$ and $V_{DSAT}$ for each transistor, however if the supply voltage is large enough, these increases can be tolerated while still maintaining a large output swing.

Unfortunately, as supply voltages are reduced, the $V_{DSAT}$ and $V_{DS}-V_{DSAT}$ margins must be reduced, transistor widths must be increased and transistor lengths decreased to maintain the same output swing. The resulting increases in parasitic capacitance and transistor output conductance can severely degrade settling performance. Alternatively, the settling performance may be partially recovered by significantly reducing the output swing, but this is unacceptable in many customer applications.

In order to increase the DAC output swing at Vout while simultaneously minimizing the impact on the settling of $V_{TAIL}$ and $V_D$ node voltages, the inventors propose to use a decoupling circuit 14 to decouple the voltage swing across the load resistors R1, R2 from the voltage swing at the drain nodes of the transistors m3 and m4. The decoupling circuit 14 of FIG. 1 allows an output swing at Vout to be increased while simultaneously reducing the voltage swing (peak-to-peak) at the drains of transistors m3 and m4, thereby reducing the impact of the increased output swing on the settling behavior of nodes $V_{TAIL}$ and $V_D$.

The decoupling circuit 14 can include a first biasing transistor BT1 and a second biasing transistor BT2 for decoupling the voltage swing across the load resistor R1 from the current steering circuit 12. The first biasing transistor BT1 and the second biasing transistor BT2 can be connected in series between the resistor R1 and a return voltage Vss. Preferably, an output of the current steering device 12 is connected by the circuit path I2 to a first coupling node NI between the biasing transistors BT1 and BT2.

In an analogous fashion, the decoupling circuit 14 can also include a third biasing transistor BT3 and a fourth biasing transistor BT4 for decoupling the voltage swing across the load resistor R2 from the current steering circuit 12. The third biasing transistor BT3 and the fourth biasing transistor BT4 can be connected in series between the resistor R2 and a return voltage Vss. Preferably, an output of the current steering device 12 is connected by the circuit path I3 to a second coupling node N2 between the biasing transistors BT3 and BT4.

The electrical circuit 10 as shown in FIG. 1 has two essential advantages over the standard DAC architecture which allow the DAC output swing to be increased. First, by appropriately sizing and biasing transistors BT1–BT4, the low frequency impedance looking into nodes N2 and N3 (that is, 1/gm, where gm is the transconductance of BT1 and BT3) can be made much smaller than the load resistance R1, R2. As a result, the peak-to-peak swing of the drain voltages of m3 and m4 is much lower than in the standard DAC of FIG. 1. Second, since only two active devices are stacked atop each other (i.e. BT3 and BT4, or BT1 and BT2), somewhat narrower and longer channel devices, biased further into saturation (larger $V_{DS}-V_{DSAT}$ margins) may be used in the circuit of FIG. 1. The resulting increase in output conductance further improves DAC performance.

Figure 2:
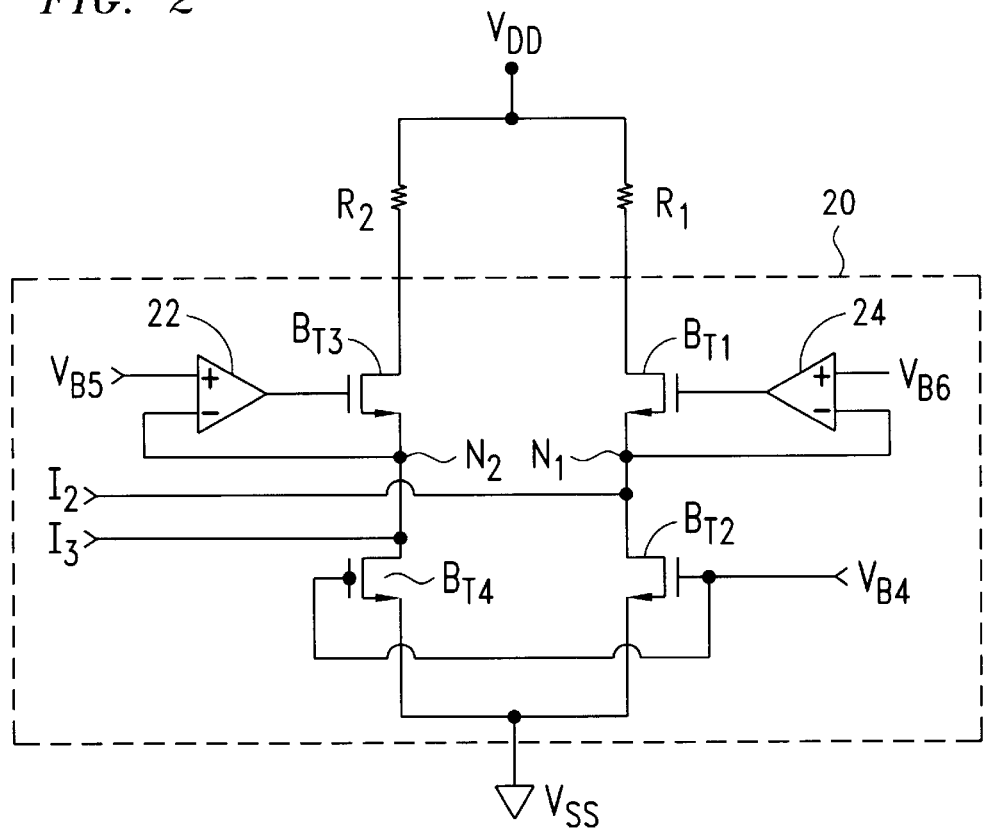
FIG. 2 is a circuit diagram of an alternative circuit for the decoupling circuit shown in FIG. 1.

FIG. 2 is a circuit diagram of an alternative decoupling circuit for the decoupling circuit 14 shown in FIG. 1. In this aspect of the invention, the four-transistor circuit including BT1–BT4 is augmented by a first feedback amplifier 22 and a second feedback amplifier 24. The first amplifier 22 drives the gate voltage of transistor BT3 until node N2 approximately equals the constant bias voltage VB5, the second amplifier 24 drives the gate voltage of transistor BT1 until node N1 approximately equals the constant bias voltage VB6. Preferably, the bias voltage VB5 equals the bias voltage VB6.

The decoupling circuit 20 has two advantages over the decoupling circuit 14. First, the open circuit output impedance looking into the drains of BT1 and BT3 is increased by a factor equal to the gain of amplifiers 24 and 22, respectively. In addition, by making VB5 and VB6 low enough, transistor BT2 and BT4 can operate in triode region, which eases headroom limitations on the bit cell transistors m1–m4 of FIG. 1, allowing the size of the transistors m1-m4 to be reduced. In this case, the presence of amplifiers 22, 24 allows triode operation while still ensuring a relatively high output resistance.

Figure 3:
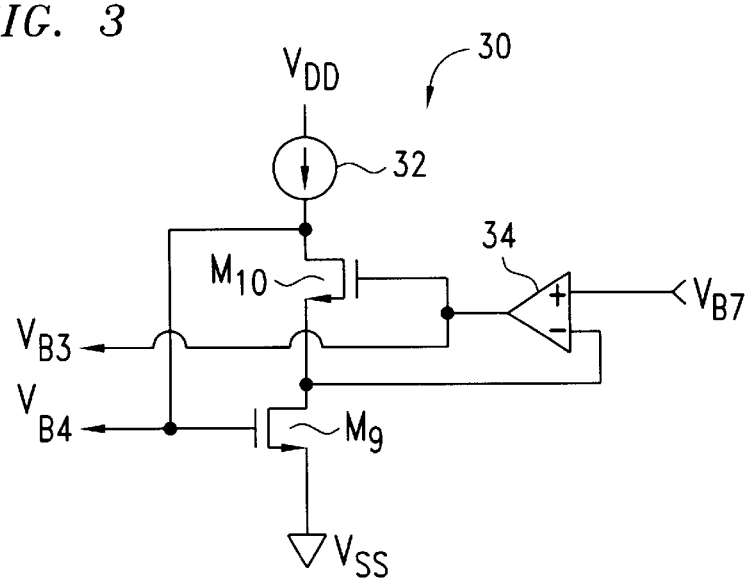
FIG. 3 shows a circuit for generating the bias voltages to the decoupling circuit of FIG. 1.

FIG. 3 shows a circuit 30 that can generate the bias voltages VB3 and VB4 for the decoupling circuit of FIG. 1. The circuit 30 includes a current source 32, an amplifier 34, a transistor m9, and a transistor m10. The transistors m9 and m10 are connected in series between the current source 32 and the return voltage Vss. The non-inverting input of the amplifier 34 is connected to a bias voltage VB7, the inverting input of the amplifier 34 is connected to the drain of transistor m9, and output of the amplifier 34 drives the gate of transistor m10. The amplifier 34 drives the gate voltage of transistor m10 until the drain of transistor m9 approximately equals the constant bias voltage VB7.

Since the amplifier 34 is not part of the output stage (as are the amplifiers 22 and 24 in FIG. 2), it does not increase the DAC output impedance. However, by forcing the drain voltage of m9 to be equal to VB7, the circuit 30 generates a bias voltage that causes the drain voltages of BT2 and BT4 (nodes N1 and N2) to also equal VB7, independent of process and temperature. By accurately setting the voltage of these nodes, we can ease the headroom requirements on the bit-cell transistors (m1–m4 of FIG. 1) and thus allow for a reduction in the widths and an increase in the lengths of the transistors m1–m4, which in turn improves the settling at nodes $V_{TAIL}$ and $V_D$.

Figure 4:
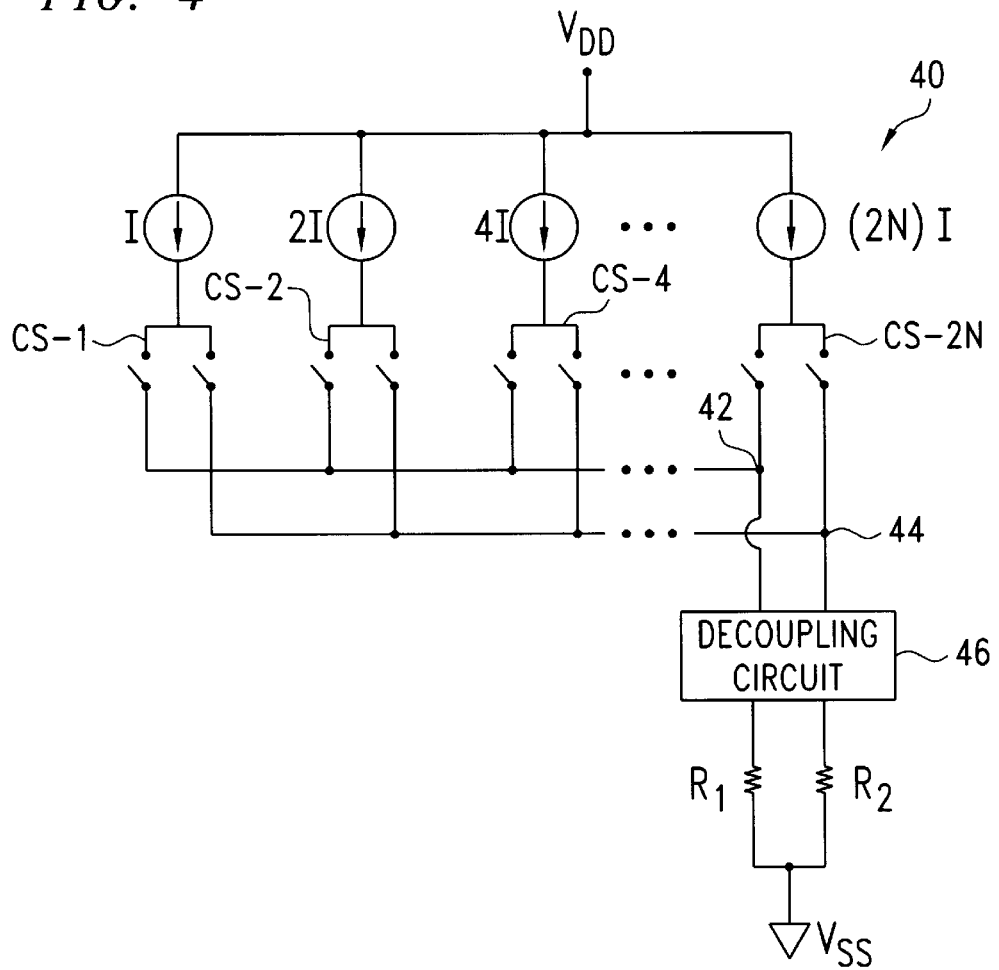
FIG. 4 is a schematic diagram illustrating the invention of FIG. 1 in a DAC.

FIG. 4 is a schematic diagram illustrating the invention of FIG. 1 in an N-bit Digital to Analog Converter 40. The DAC 40 includes N current sources identified as I, 2I, 4I, . . . , (2N)I. Each of the current sources is operably coupled to an associated current steering circuit, identified as CS-1, CS-2, CS-4, . . . , CS-2N. The current steering circuits direct the current towards either resistor R1 or resistor R2. The output of the current steering circuits are coupled together at nodes 42 and 44. The decoupling circuit 46 receives as input the signals at nodes 42 and 44. The decoupling circuit outputs two signals across the load resistors R1 and R2. The decoupling circuit 46 can be either the decoupling circuit 14 of FIG. 1, the decoupling circuit 20 of FIG. 2, or any other decoupling circuit that operate in accordance with this invention.

Figure 5:
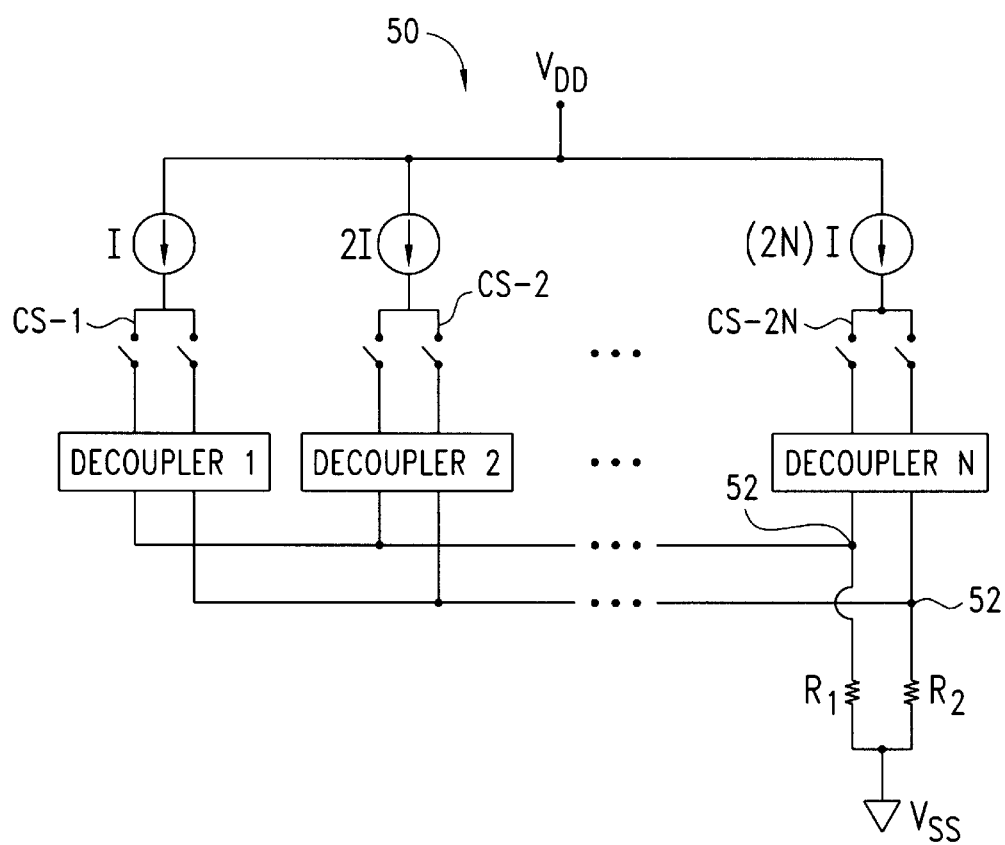
FIG. 5 illustrates an alternative schematic diagram of a DAC containing the invention of FIG. 1.
Figure 6:
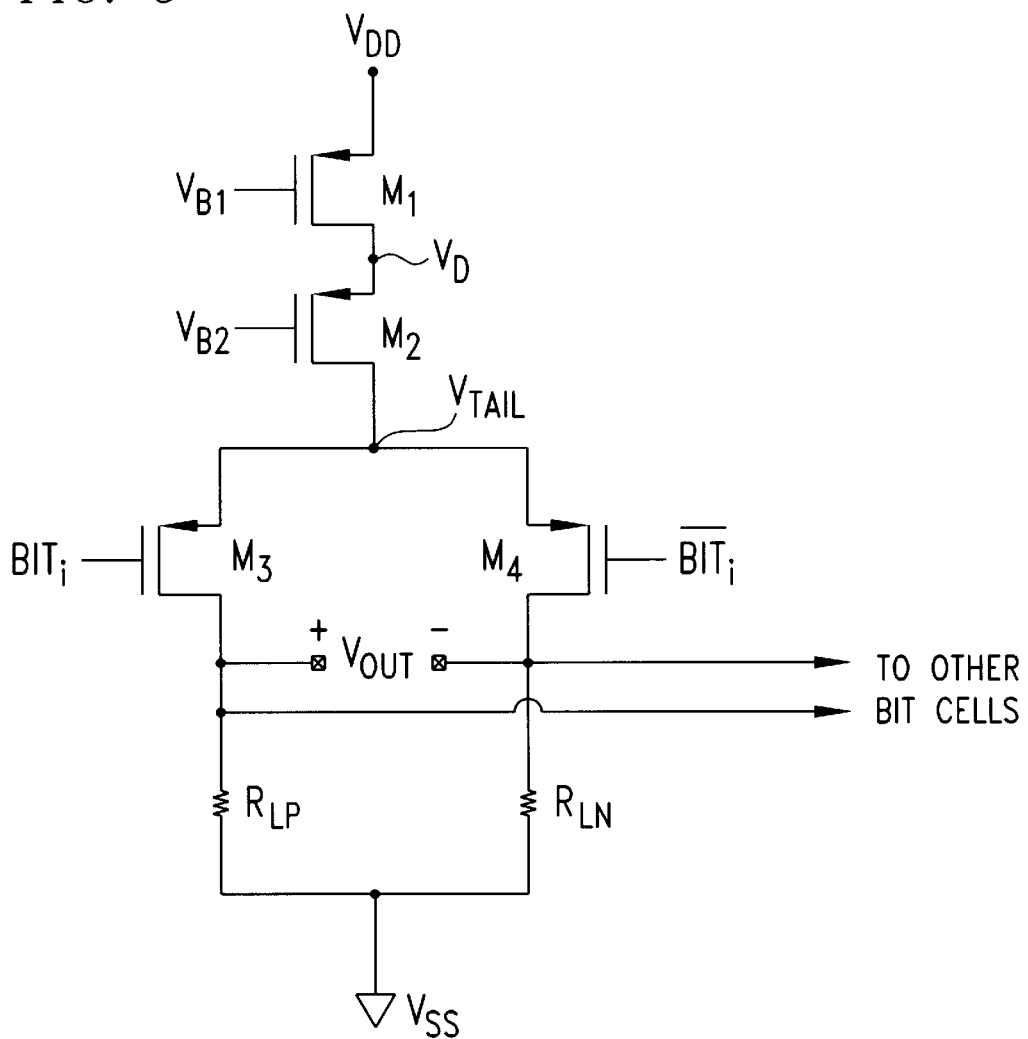
FIG. 6 shows a standard single-bit cell for a current-steered DAC.

FIG. 5 is a schematic diagram illustrating the invention of FIG. 1 in an N-bit Digital to Analog Converter 50. The DAC 50 includes N current sources identified as I, 2I, 4I, . . . , (2N)I. Each of the current sources is operably coupled to an associated current steering circuit, identified as CS-1, CS-2, CS-4, . . . , CS-2N. The current steering circuits direct the current towards either resistor R1 or resistor R2. The outputs of each of the steering circuits are operably coupled to an associated set of decoupling circuits, labeled decoupler 1, decoupler2, . . . , decoupler N. The decoupling circuits 1–N each operate in accordance with the description of the decoupling circuit 14 of FIG. 1, the decoupling circuit 20 of FIG. 2, or any equivalents thereof. The output of the decoupling circuits are coupled together at nodes 52 and 54.

As shown in FIG. 5, the decoupling circuit 14 may either be used on a per-bit-cell basis, with each bit cell having its own decoupling circuit. Alternatively, as shown in FIG. 4, a single decoupling circuit may serve all bit cells of the ADC.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and is not limiting.

We claim:

1. An electrical circuit that receives a current I1 as an input signal, the electrical circuit comprising:

a first load resistor R1, a second load resistor R2, a current steering circuit that steers at least part of the current I1 through a circuit path towards either the first resistor R1 or the second resistor R2, and a decoupling circuit operably coupled between the current steering circuit and the load resistors R1, R2, wherein the decoupling circuit decouples voltage swings across the load resistors R1, R2 from the current steering circuit.

2. The electrical circuit of claim 1, wherein the current steering circuit steers at least part of the current I1 through a circuit path in response to a control signal.

3. The electrical circuit of claim 2, wherein the current steering circuit includes a first switching transistor and a second switching transistor.

4. The electrical circuit of claim 3, wherein the first and second switching transistors are alternately conducting in response to the control signal.

5. The electrical circuit according to claim 1, wherein the decoupling circuit causes the voltage swings at the input to the current steering circuit to settle more quickly than the voltage variations across the load resistors.

6. The electrical circuit according to claim 5, wherein the decoupling circuit further includes:

a first biasing transistor BT1, and a second biasing transistor BT2, for decoupling the voltage swings across the load resistors R1 from the current steering circuit.

7. The electrical circuit according to claim 6, wherein:

the first biasing transistor BT1 and the second biasing transistor BT2 are connected in series between the first resistor R1 and a return voltage Vss.

8. The electrical circuit according to claim 7, wherein the output of the current steering circuit is connected to a first coupling node between biasing transistors BT1 and BT2.

9. The electrical circuit according to claim 8, further including a feedback amplifier operably coupled between the first coupling node and the gate of biasing transistor BT1.

10. The electrical circuit according to claim 6, wherein the biasing transistor BT1 is sized such that the low frequency impedance looking into the decoupling circuit from the load resistor R1 is less than the load resistor R1.

11. The electrical circuit according to claim 1, wherein the current I1 is generated by a current source.

12. An analog to digital converter, comprising:

a current source that generates a current I1, a first load resistor R1, a second load resistor R2, a current steering circuit that steers at least part of the current I1 through a circuit path towards either the first resistor R1 or the second resistor R2, and a decoupling circuit operably coupled between the current steering circuit and the load resistors R1, R2 wherein the decoupling circuit decouples voltage swings across the load resistors R1, R2 from the current steering circuit.

13. The electrical circuit according to claim 12, wherein the decoupling circuit causes the voltage swings at the input to the current steering circuit to settle more quickly than the voltage variations across the load resistors.

14. The electrical circuit according to claim 13, wherein the decoupling circuit further includes:

a first biasing transistor BT1, and a second biasing transistor BT2, for decoupling the voltage swings across the load resistors R1 from the current steering circuit.

15. The electrical circuit according to claim 14, wherein the biasing transistor BT1 is sized such that the low frequency impedance looking into the decoupling circuit from the load resistor R1 is less than the load resistor R1.

* * * * *